United States Patent [19]

Heckman

[11] Patent Number: 5,523,955
[45] Date of Patent: Jun. 4, 1996

[54] SYSTEM FOR CHARACTERIZING AC PROPERTIES OF A PROCESSING PLASMA

[75] Inventor: Randy L. Heckman, Fort Collins, Colo.

[73] Assignee: Advanced Energy Industries, Inc., Ft. Collins, Colo.

[21] Appl. No.: 854,804

[22] Filed: Mar. 19, 1992

[51] Int. Cl.$^6$ ..................................................... H05H 1/00
[52] U.S. Cl. ........................................ 364/483; 315/111.31
[58] Field of Search ................................. 364/550, 481, 364/483, 552; 324/76.76; 204/298.03, 298.08, 298.32, 192.1, 192.13, 192.32, 192.33; 315/111.21, 111.31; 333/32; 156/627; 313/231.31

[56] References Cited

U.S. PATENT DOCUMENTS

| | | | |
|---|---|---|---|
| 3,614,606 | 10/1971 | Schmidt et al. | 324/663 |
| 4,104,583 | 7/1978 | Engen | 324/638 |
| 4,207,137 | 6/1980 | Tretola | 156/627 |
| 4,427,936 | 1/1984 | Riblet et al. | 324/638 |
| 4,489,271 | 12/1984 | Riblet | 324/638 |
| 4,521,728 | 6/1985 | Li | 324/638 |
| 4,571,545 | 2/1986 | Griffin et al. | 324/630 |
| 4,579,618 | 4/1986 | Celestino et al. | 156/345 |
| 4,622,094 | 11/1986 | Otsubo | 156/627 |
| 4,629,940 | 12/1986 | Gagne et al. | 315/111.51 |
| 4,641,082 | 2/1987 | Griffin et al. | 324/638 |
| 4,847,792 | 7/1989 | Barna et al. | 364/552 |
| 4,935,661 | 6/1990 | Heinecke et al. | 313/231.31 |
| 4,954,212 | 9/1990 | Gabriel et al. | 156/627 |
| 4,956,582 | 9/1990 | Bourassa | 315/111.21 |
| 4,990,859 | 2/1991 | Bouyer et al. | 324/649 |
| 5,014,217 | 5/1991 | Savage | 364/550 |
| 5,053,725 | 10/1991 | Gesche et al. | 333/17.3 |
| 5,175,472 | 12/1992 | Johnson, Jr. et al. | 315/111.21 |

FOREIGN PATENT DOCUMENTS

| | | |
|---|---|---|
| 63-178027 | 4/1090 | Japan . |
| 64-199257 | 6/9791 | Japan . |
| 982700 | 2/1965 | United Kingdom . |

OTHER PUBLICATIONS

Paul Rummell; Monitoring & Control of RF Electrical Parameters.
Near Plasma Loads; pp. 20–23, May, 1991.
Elizabeth Pennisi; Pass the Plasma, . . . Please;. 312–314; May 1991.
Glenn Engen; Calibration of an Arbitrary Six–Port Junction for Measurement of Active & Passive Circuit Parameters; pp. 295–299; Dec. 1973.
Glenn Engen; An Improved Circuit for Implementing the Six–Port Technique of Microwave Measurements; pp. 1080–1083; Dec. 1977.
Glenn Engen; Determination of Microwave Phase & Amplitude from Power Measurements; pp. 414–418; Dec. 1976.

(List continued on next page.)

Primary Examiner—Michael Zanelli
Attorney, Agent, or Firm—Luke Santangel

[57] ABSTRACT

A probe to be inserted in-line in an AC plasma processing system allows accurate, real time determination of plasma parameters such as power and complex impedance over a broad dynamic range. Any need to know power output from a source is avoided and signals are selected to optimize accuracy such that only two alternating signals need be sensed for many applications. Signals are selected such that magnitudes of simple alternating signals can be easily measured as scalar values in a fashion that affords the use of these values to completely characterize the power actually delivered to the processing plasma and its complex impedance in real time. Plasma characterization can be limited to only specific frequencies for more accurate determination. Microstrip directional couplers are used to sense signals from the power transmission. These signals are then utilized to derive simple alternating signals representative of power or voltage. Three or more scalar values representative of the magnitude of the alternating signals and their combination serve as the variable inputs to determine complex reflection coefficient or impedance using known formulas. Use of a sign bit detector or assumptions with respect to the processing plasma is disclosed for complete characterization of the plasma in an efficient manner.

56 Claims, 5 Drawing Sheets

OTHER PUBLICATIONS

Glenn Engen; Application of an Arbitrary 6–Port Junction to Power–Measurement Problems; pp. 470–474; Nov. 1972.

H. R. Koenig. L. I. Maissel; Application of RF Discharges to Sputtering; pp. 168–171; Mar. 1970.

"External Measurement on a Plasma Etch Chamber and Their Interpretation Regarding Plasma Properties and Etch Conditions," IEEE International Conference on Plasma Science; Canada; Carlile et al; p. 17.

"A Broadband Short–pulse Plasma Diagnostic Technique for Measuring Electroacoustic Resonances," Jun. 1972 Proceedings of IEEE, vol. 60; Baird; pp. 754–755.

"High Impedence Capacity Divider Probe for Potential Measurements in Plasmas;" Review of Scientific Instruments; vol. 53 No. 10; Oct. 1982; United States; Benjamin; pp. 1541–1543.

SYSTEM FOR CHARACTERIZING AC PROPERTIES OF A PROCESSING PLASMA

BACKGROUND OF THE INVENTION

The present invention relates generally to the accurate measurement of the characteristics of a processing plasma powered by alternating currents such as is used in thin film processing. Specifically, the invention focuses upon accurately determining alternating current characteristics such as delivered power and complex impedance throughout the broad dynamic ranges typically encountered during plasma processing.

The technique of material processing through the utilization of plasmas has been known for many years. In one application, it may involve the production of thin films on a surface through the action of the plasma, while in another it may involve the etching of those same films, also through the action of the plasma. In recent years the commercial demand for the equipment involved has increased significantly as its application to the creation of microchips and other semi-conducting devices has been refined. Basically the technique involves the ignition and maintenance of a processing plasma through the application of electric power to the plasma. The plasma then interacts with gases introduced and the surfaces involved to effect the processing desired.

Since the dynamics of the plasma itself and its effect on the gases and surfaces involved are rather complex, this entire field has evolved in a unique fashion from a number of perspectives. First, due to the increasing complexity of the semiconductor device often manufactured, tighter and tighter control of the process itself has been required. To this end, processes which were previously thermal or liquid (wet) chemical processes have been converted to plasma processes. Most of these are processes using alternating current driven processing plasmas.

A second characteristic of the field involved is that this field has evolved with a primary focus upon the plasma itself, not the circuitry involved. Although those skilled in the art have long desired certain refinements in electrical circuitry and capabilities, the suppliers of AC power generation equipment and handling equipment for plasma processing have generally applied techniques long known in the communication field, without always recognizing the differences between the nonlinear plasma load and the linear antenna (the usual load for communications equipment). While plasma-oriented physicists and chemists have greatly expanded the understanding of the processes involved, advancements with respect to the alternating power supplied and the circuits involved have not occurred to the same degree.

As those skilled in the art have come to understand, the nature of the processing plasmas being utilized does not easily lend itself to modeling as a simple circuit element in an AC circuit. Rather, with even detailed circuit knowledge, the inclusion of a plasma in an AC circuit is inherently difficult. This is because in most processing environments the plasma acts not just as an active element—that is, one whose characteristics depend upon other system parameters such as gas pressure and temperature—but it also acts as a highly nonlinear element. As a nonlinear element, the plasma changes its electrical characteristics depending upon the power applied to it in a discrete fashion throughout the range of operations and environments. This effect is particularly acute in instances where alternating power is utilized because vast variations in the character of the plasma can occur even over one cycle of the alternating power, voltage, or current. The plasma's nonlinear character has made traditional circuit analyses extremely difficult.

As this invention highlights, in order to achieve the tight process control required in modern plasma processing, more information is required about the plasma under actual processing conditions. This usually cannot be done by direct plasma measurements because, as will be seen later, the tools required are intrusive to the process. On the other hand, those skilled in the art have recognized that many plasma parameters are reflected in the complex impedance presented to the AC power generation system. It therefore becomes desirable to determine the impedance as well as the power delivered to the plasma. For these reasons, the plasma scientists will need to adopt a multi-disciplinary approach to many problems presented. With respect to the present invention, those skilled in the art have long desired a more accurate device to determine the characteristics of the processing plasma throughout a variety of conditions. The desire to know the delivered power and complex impedance of the plasma chamber during a given process has been desired not only to "fingerprint" the process, but also to regulate the power that is being directly coupled into the processing chamber in order to make processing more controlled and repeatable. Information on the complex impedance of the processing plasma could also be monitored for any possible change that might indicate the end of a given process. Until the present invention, however, the techniques needed to accomplish these goals in an accurate and stable fashion have not been available to those skilled in the art.

In pursuing these goals, the plasma's nonlinear character has made the use of traditional approaches difficult. Not only do traditional variables, such as voltage and current, vary dramatically among processes, they also vary over even one cycle of the alternating power, Additionally, relatively large angles between these parameters are often characteristic of the plasma. Each of these have resulted in the practical difficulty of measuring power when voltage may be extremely large but current extremely small and vice-a-versa. In this regard note that at a phase angle of 80° a phase error of only 0.1° produces an error of 1% in the calculated power.

In characterizing the plasma in order to control the process occurring, those skilled in the art have sought to optically analyze the plasma or have relied upon potentially intrusive techniques to achieve the desired goal. Optical techniques are not only expensive, but for many processes the optical paths are coated or otherwise disturbed, reducing accuracy and requiring maintenance functions. In-plasma probes such as Langmuir probes and the like are intrusive to the process and the chamber. In order for a technique to be practical, these disadvantages must be avoided. These include avoiding any intrusion into the processing chamber, any imposition of serious equipment design constraints due to the requirement to have access to the plasma or its emissions directly, and high cost. The intrusiveness aspect is inherently avoided by an electrical circuit technique, since the impedance measurement can be made with equipment outside of the plasma chamber. Second, imposition of equipment design constraints, is greatly ameliorated if the power and impedance measurement device can be made sufficiently small to fit in the usually cramped space between the matching network and the chamber feedthrough. Also, the cost can be kept low if the design uses a small number of low-cost components and can be easily repeatedly manufactured. Finally, the impedance measurement must be made with sufficient resolution and stability to hold its correlation to the plasma parameters from run to run and throughout the lifetime of the process(es). This also permits reduction in machine-to-machine variations, improving the overall manufacturing process.

There have been some prior efforts to electrically characterize the processing plasma by ascertaining impedance, power delivered, reflection coefficient and the like. First, the measurement of power delivered to the plasma has been attempted at some distance (electrically speaking) from the processing plasma. Through this technique, those skilled in the art have sought to understand the power actually applied to the plasma by measuring the power output by the source or by making measurements prior to any matching network. While this may have proved sufficient in order to afford repeatability and adequate control of the plasma processing system in some applications, the fact that such power measurements can have as much as a fifty percent difference between the power supplied and that actually delivered to the plasma has presented a limitation in understanding. In addition, the fact that this difference is not stable and can be affected by heating and other aspects has presented further limitations even with respect to controlling the process from run to run. For many applications, these limitations are unacceptable. An example of such a situation is that involving the accurate application of high power to achieve a particular process. In such a situation, multiple kilowatts of power might be applied while also needing to maintain the level to within a few watts. The inaccuracies inherent in a pre-network measurement of AC power have proven unacceptable in this type of application.

Recently another technique has been proposed in which the voltage and current is directly measured at the output of the matching network. Inherent difficulties with such voltage and current measurements have limited its accuracy, and the details of the instrumentation used (heterodyning and direct signal multiplication) have further limited the accuracy and stability. In addition calibration is a problem as no standards exist for accurate voltage and current measurement at the frequencies involved. Finally, the heterodyning technique limits the frequency response of the instrumentation, which can be a serious problem if the measurement device is placed in a feedback control system to hold the plasma parameters steady in actual operation.

Even the standards adopted by those skilled in the art have lead those away from the direction taken by the present invention. Since it has become a standard to design power supply and other equipment around the 50 ohm standard load, measurement techniques involved have also often assumed the ability to always return to this standard. With a plasma this is simply not possible as the nonlinear character does not even make the simple assumption that a clean source (as viewed into a purely resistive load) would result in a clean signal as viewed into a plasma load practical. In fact, the opposite has been shown to be true.

As mentioned earlier, it has been a recognized need to accurately control the plasma processing environment in an AC power situation. In spite of this need, those skilled in the art have simply failed to see solutions to the problems which achieve the degree of accuracy desired. To some extent the solutions taught by the present invention have actually been directed away from by a variety of factors including the standards which have evolved and the expertise which those skilled in the art have brought to bear on the problem. This teaching away has even existed to the point where those skilled in the art have assumed that in an AC power environment where a nonlinear load varies even over a single cycle, the characterization could not be practically ascertained. Each of these perceived limitations has been overcome by the present invention. Until the present invention, the accurate measurement of the characteristics of the plasma through an in-line electrical device has not been possible. Additionally, the present invention shows that it is possible to characterize the plasma accurately without intruding upon the plasma process itself over power source dynamic ranges of as much as 25 dB or more as are involved in many plasma processing environments.

SUMMARY OF THE INVENTION

Accordingly, the present invention provides a system whereby a compact, in-line probe can be inserted adjacent to the plasma processing chamber and can accurately determine, among other aspects, the power actually delivered to the plasma and the complex impedance of the plasma. The system has the capability of ascertaining the plasma character without any requirement of knowing the power level output by the power source. To do so, it senses signals from the power transmission in an optimum fashion and avoids inaccuracies potentially inherent when large dynamic ranges are involved. The invention uses a microstrip directional coupler to derive simple alternating signals from which magnitudes of the signals can then be measured as simple scalar values. Using well known formulas, the system then uses these scalar values to calculate power, complex impedance, complex reflection coefficient, or other parameters of the plasma. It allows accurate characterization of the processing plasma. The invention also allows each of these parameters to be limited to specific frequencies so that the characterizations can be isolated to each frequency separately.

Accordingly it is an object of the present invention to afford a system which can be practically implemented by those having representative skill in the art. Specifically, a goal is that the invention be capable of being embodied in a device which can be inserted in-line immediately adjacent to the processing plasma chamber. The device should be able to be inserted between the source and the load in a high power application so that it appears to be a substantially lossless addition to the configuration. In keeping with the general goal of being able to be practically implemented, it is a goal of the invention to not require any knowledge of the power output by the alternating power source involved. Further, in keeping with the general goal, it is desired that the present invention be able to be relatively inexpensively implemented.

Another general goal of the present invention is that it be extremely accurate. In keeping with this goal, accuracies on the order of fractions of a percent are desired. It is also a goal that these accuracies be maintained over the broad dynamic ranges typically encountered in a processing plasma environment. In order to achieve the accuracies desired at the frequencies typically used, it is also a goal that the device be very compact so that it can be placed where the most accurate information might be determined. An object of the invention is to accurately determine the delivered power and complex reflection coefficient of a processing plasma independent of the power level of the source. In order to maximize the measurement accuracy and detection bandwidth, a goal is also to utilize only power or voltage levels at detectors within the device to precisely determine all amplitude and phase information. To further the general goal of accuracy, it is also a goal that the invention have the capability of limiting the frequencies over which the plasma characterization might be achieved. Since plasma processing may require only brief time periods, it is a goal to provide real time measurement capability limited only by device characteristics, not technique limitations. It is also the object of this invention to use the fewest components to reduce size, cost, complexity, and data processing time while still maintaining measurement accuracy.

In recognition of the fact that the device is designed to be used non-obtrusively in a plasma processing environment, it is a goal to provide a system which has little or no impact on the process itself. Accordingly, a goal is to provide a system which has minimal power drain in order to achieve its measurement objectives. Only an insubstantial percentage of the power supplied is consumed by the characterization system.

Another general goal is to provide a system which optimizes the selection of signals and variables in achieving its calculations. In keeping with this goal, embodiments are disclosed which have the capability of assuming certain parameters which characterize the plasma where practical. In order to achieve the goal of optimizing the selection of signals and variables, the present invention utilizes scalar representations of magnitudes of alternating signals to not only simplify the characterization calculations, but also to achieve optimal accuracy. Further, a goal is to provide the capability of combining signals where possible so that minimal components and sensing is necessary.

Naturally, further objects of the invention are disclosed throughout other areas of the specification and claims.

DETAILED DISCUSSION OF THE PREFERRED EMBODIMENTS

Figure 1:
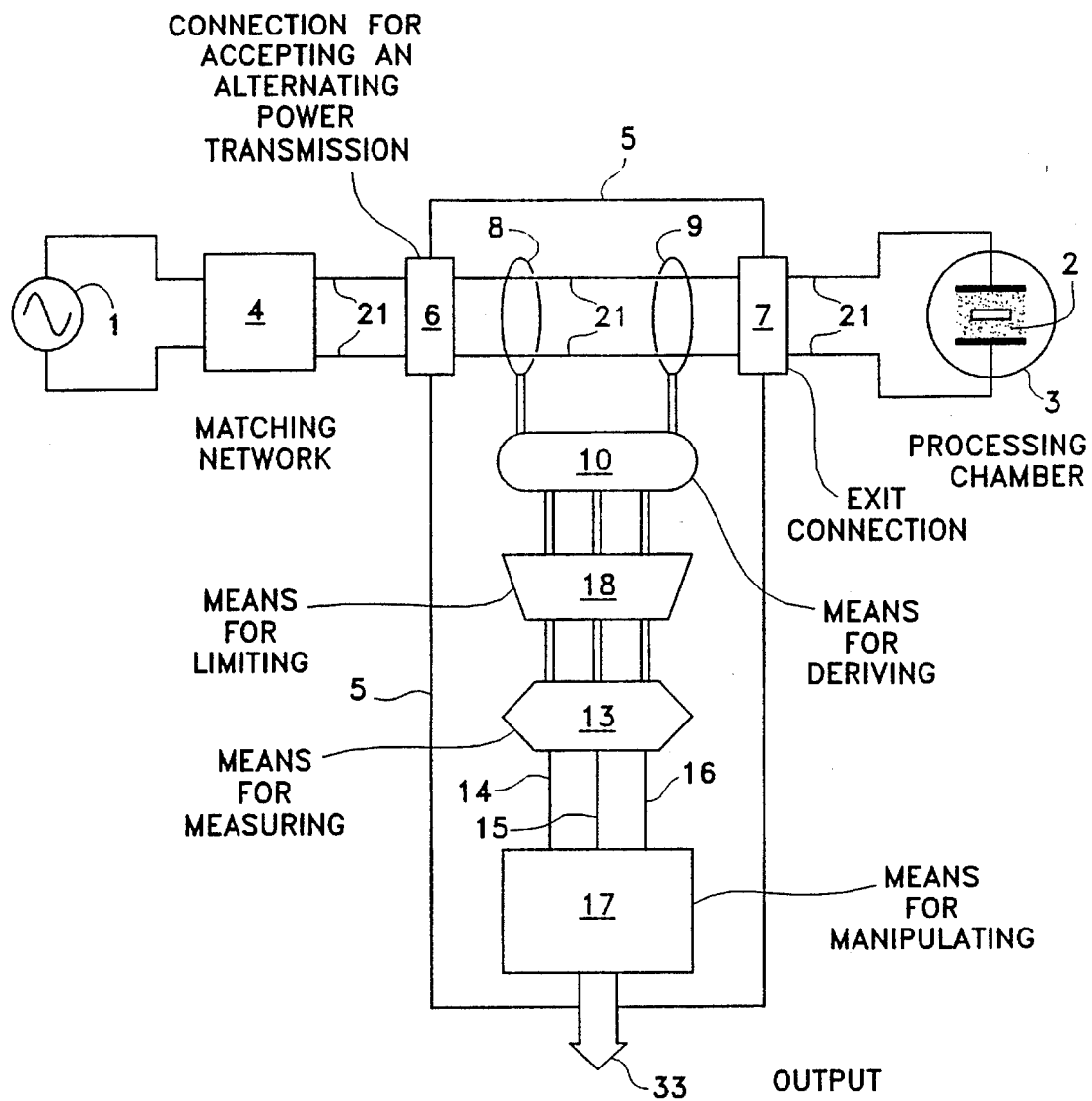
FIG. 1 is a schematic view of a plasma processing system incorporating the present invention.

As can be seen from the drawings, the basic concepts of the present invention may be embodied in a variety of ways. While particular embodiments of the invention will be described, it will be obvious that changes and modifications may be made without departing from the broad aspects of the present invention. Referring to FIG. 1 it can be seen how the present invention can be easily incorporated into a typical plasma processing system. FIG. 1, a schematic of a plasma processing system with an embodiment of the present invention included, illustrates both details with respect to plasma processing in general and the present invention.

As shown, a plasma processing system involves alternating power source (1) which generates typically sinusoidal voltage and current waveforms to power processing plasma (2). In this field, usually alternating power source (1) operates in the high frequency band at 13.56 megahertz due certain regulatory requirements. It should be understood, however, that the fundamental principles taught by the invention are not significantly dependent upon the frequency of alternating power source (1).

As mentioned, alternating power source (1) generates an alternating power transmission which is directed to processing plasma (2) in some fashion such as power transmission line (21). In order to maintain conditions appropriate for processing plasma (2), processing plasma (2) is contained within processing chamber (3) within which pressure, constituency, and other parameters can be controlled. One of the difficulties in maintaining a set power transmission level into processing plasma (2) is the large variation in impedance in processing plasma (2). Typically, before processing plasma (2) is ignited, it characteristically has very high impedance. Once ignited, the impedance of processing plasma (2) tends to discretely reduce. Even during processing, the impedance of processing plasma (2) varies based upon power, voltage, current, pressure, gas type and other variables. These inherent variations, and the fact that alternating power source (1) is typically designed to operate optimally for a particular impedance load of 50 ohms, have lead those skilled in the art to include matching network (4) to interactively coordinate the circuit as appropriate for alternating power source (1) and the load experienced by it. Since matching network (4) is designed to vary the impedance experienced by alternating power source (1) and since processing plasma (2) varies greatly in its characteristics, matching network (4) must also have a large degree of impedance variation. This variation can result in significant power consumption by matching network (4). As mentioned earlier, this is one reason the techniques typically used by those skilled in the art of measuring power prior to matching network (4) are so inaccurate in terms of determining the power actually delivered to processing plasma (2).

As shown schematically in FIG. 1, the present invention is simply a device inserted in-line between matching network (4) and processing chamber (3). The device is essentially probe (5) which includes a connection or other means for accepting an alternating power transmission (6) as the device's input. Importantly, the power transmission is then utilized by probe (5) and passes through probe (5) into processing chamber (3). In order to meet the requirements of the application, a substantial portion of the power accepted by probe (5) should be passed to processing chamber (3). By "substantial" it is meant that minimal power losses are associated with probe (5) so that the majority of power transmitted by alternating power source (1) actually reaches processing plasma (2). Although in other arts up to 75% of supplied power is drained by an impedance measuring device, in this particular field, it is desired that less than a fraction of a percent of power be used as part of the measurement process so that the majority can be passed through to processing plasma (2). Through the techniques taught in the present invention, efficiencies of this order are achieved for most applications. In achieving such efficiencies it should be understood that the means for passing a substantial portion of power includes not only exit connection (7), but also the particular circuitry utilized within probe (5). Obviously a variety of said circuitries might be used, however, the essence of this element is that the entire probe design not utilize any significant amount of power with respect to the processes involved.

Due to the fact that at the typical frequency of operation the distance of simple connections from probe (5) to processing chamber (3) can importantly affect the accuracy of the measurements, it is important that probe (5) be as compact as possible so that it might be connected relatively closely electrically to processing chamber (3). The present invention achieves this through utilization of a design which requires the minimum number of components and which immediately transforms sensed signals into those capable of being analyzed or displayed by other equipment.

As shown schematically in FIG. 1, probe (5) includes a variety of functionally different components. It should be understood that the confines of probe (5) are intended to be conceptual, not physical such that those elements requiring compact design might be optimized for size while other elements need not be so optimized. As an example, it can be seen that probe (5) results in some output or display (33). This display may or may not be included physically within the in-line device. As presently envisioned in a preferred embodiment, such display would be accomplished through a separate computer which interfaces with a variety of devices within the entire plasma processing circuit. This separate computer should be conceptually considered part of probe (5) even though not physically part of the in-line device. As discussed later, the amount of information available to the computer for the purposes achieved by this invention might even be information not considered to be known to probe (5) as it achieves its characterization of processing plasma (2). Thus, the confines of probe (5) are primarily conceptual, not physical, in nature.

Likewise the type of display chosen may be varied. The resulting information may be presented graphically on a Smith chart or other graphical format, as well as electronically stored to a file, or transferred to a printer or plotter. In this regard, it is not the intent to limit the means by which this data could be presented, but rather disclose the means used to accurately measure delivered power and complex impedance for high alternating power applications into nonlinear plasma loads.

Referring to the schematic details within probe (5) as shown in FIG. 1, it can be understood that probe (5) includes a means for sensing at least two signals from the power transmission. These are shown schematically as first means for sensing (8) and second means for sensing (9), of course additional sensors might be included and such sensors might even be combined into one. In achieving the sensing of some signal from the alternating power transmission, a variety of techniques well known to those skilled in the art might be utilized, so long as information is gained from this power transmission itself. These techniques may include common sensor elements, lumped elements, stripline or microstrip devices, or even waveguide technology. While some of these are better suited for higher frequencies, the theory of each may still allow successful performance at low frequencies. In addition, digital acquisition techniques may be used. In the digital technique, a signal might be digitized and, by means of digital signal processing, manipulated to result in the same detected signals as would be derived with real components.

First and second means for sensing (8 and 9) might also be accompanied by a third or fourth means for sensing which might even be different in terms the techniques in which they sense signals or derive information from the power transmission. The nature of these signals may also vary. While in one preferred embodiment, the preferred signals encompass voltages, not only could the unit vary (so currents, powers, or other elements might be measured), but also any variety of signals might be sensed. Such signals might naturally be representative of some mathematical combination of values as well. This generality affords variation in analysis techniques as characterization of processing plasma (2) might be achieved mathematically through a variety of well-known equations. In order to accommodate each variation, this patent specifies only that signals be sensed and thus accommodates a variety of the types of signals which might be utilized.

Once sensed, probe (5) then schematically shows a means for deriving (10) at least three alternating signals from potentially no more than two sensed signals. This means may also be separated into a first means for deriving and a second means for deriving or others as well. Together they should output at least three alternating signals. As can be understood, these alternating signals can have any character so long as they are related in some way to the signals sensed off power transmission line (21).

Means for deriving (10) might take a number of forms as well. It might range from a direct pass through of the actually sensed signals to some form of voltage step down means to even some type of mathematical or other processing device so long as the result is an alternating signal. The potential of processing in order to create one of the alternating signals is particularly important as in one preferred embodiment it is envisioned that some combination of signals representative of the originally sensed signals would constitute the third alternating signal. Again, any variety of combination techniques might be utilized, however, it is not presently intended for such combination techniques to encompass heterodyning techniques as these techniques inherently involve the limitations mentioned earlier and do not truly create the alternating signals from only the sensed inputs.

Once so derived, the three alternating signals may pass through one or more means for limiting (18) the content of these signals and into a means for measuring (13). Again, each of these might be one single device or it might be a combination of a variety of devices. Fundamentally, this means for measuring (13) results in at least three scalar values which are representative of the magnitude of the three alternating signals. By being representative of magnitude of the alternating signal, these scalar values may encompass any value easily measured such as peak, average, or other values so long as no DC bias is included in measuring the magnitude of the alternating signal. By utilizing voltage values, the resultant magnitude might be considered representative of the power involved, it might even be proportional to the square root of such power. Again, any such variation naturally falls within the scope of this patent. In one embodiment, the signals sensed are peak detected to result in an analog voltage proportional to the voltage of the sensed signal and perhaps to the square root of the power involved. Although a signal directly proportional to the power at each port could also be used, the dynamic range and resolution at low power levels may be maximized by use of an analog voltage proportional to the square root of the power. Each signal may then be digitized and transmitted serially to a computer, where the calculations for delivered power and the complex reflection coefficient can be made. These calculations could also be accomplished by hard-wired circuits as can be readily understood.

Importantly, means for measuring (13) results in scalar values which can then be easily analyzed. These scalar values might be transmitted on first, second and third scalar lines (14, 15, & 16 respectively) to be analyzed within the conceptual confines of probe (5). As shown schematically, they input to means for manipulating (17) to characterize processing plasma (2). As mentioned, means for manipulating (17) might include a separate computer and associated software or hard-wired circuitry, so long as a characterization of processing plasma (2) is accomplished. In accomplishing such manipulation, these three scalars or simple magnitude values are the variable inputs which significantly act to characterize processing plasma (2). While naturally other variable inputs might also be involved into means for manipulating (17) in one embodiment, these three scalars are the only variable inputs utilized. Similarly, only the three alternating signals derived might be considered variable inputs. Thus in the most efficient manner, the plasma might be sufficiently characterized.

Figure 2:
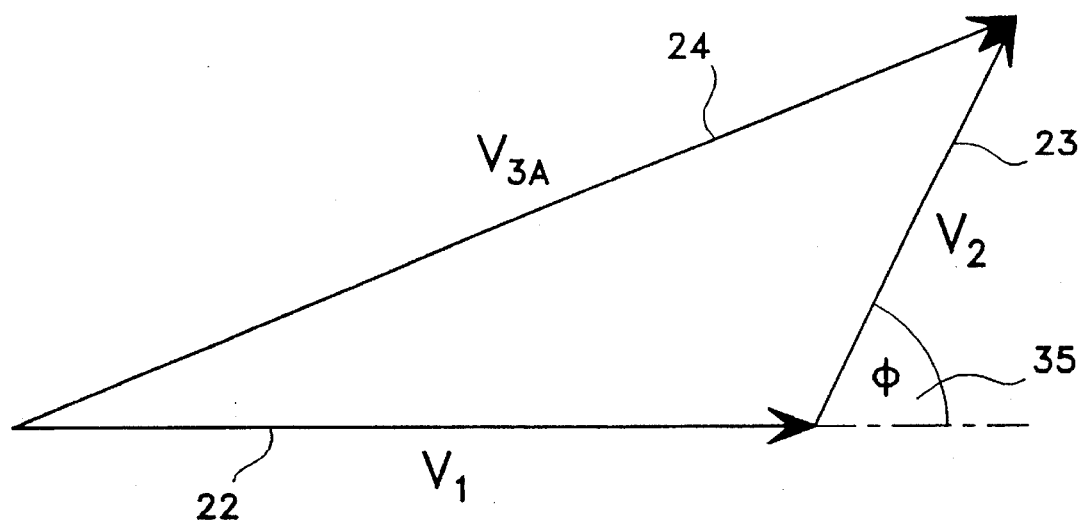
FIG. 2 is a vector diagram illustrating the basis of the mathematical calculations used to determine parameters according to one embodiment of the present invention.
Figure 3:
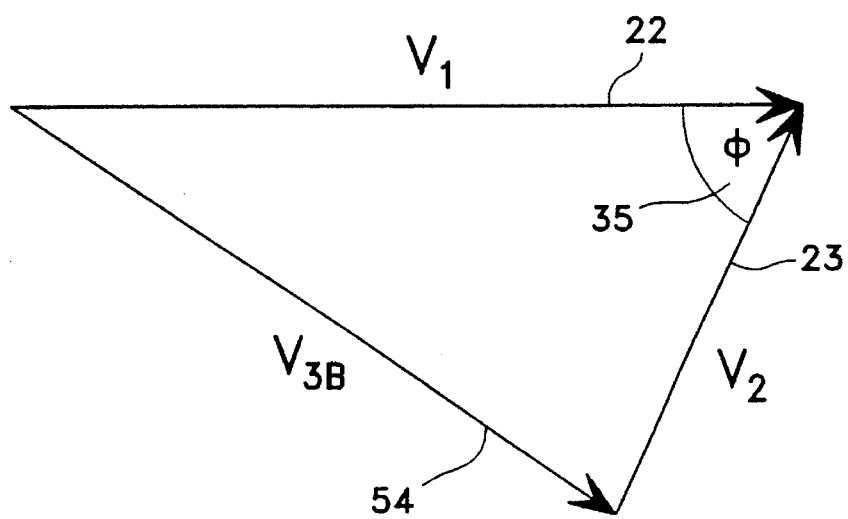
FIG. 3 is another vector diagram showing the basis of an alternative calculation scheme.

Referring to FIGS. 2 and 3, the nature of the manipulation of and variability in signals chosen can be easily understood through the use of vector diagrams to illustrate the original and derived alternating signals involved. In this respect, it should be understood that since the alternating signals derived in a preferred embodiment are merely voltage reductions of the actual signals sensed, the vectors shown in FIG. 2 are representative of both the original signals and their respective alternating signals. Referring to the vectors shown in FIG. 2, it can be seen that a vector addition of the first alternating signal vector, $V_1$ (22) and second alternating signal vector, $V_2$ (23) can be utilized to yield a third vector, $V_{3A}$ (24). Through proper selection of the signals sensed, this third vector, $V_{3A}$ (24) can be immediately representative of the voltage across processing plasma (2).

As can be seen from FIG. 3, the difference between the vector representation of the first alternating signal vector, $V_1$ (22) and the vector representation of the second alternating signal vector, $V_2$ (23) yield another vector, $V_{3B}$ (54) which may be representative of some constant times the current through processing plasma (2). As can be seen phase angle (35) is involved in both FIGS. 2 and 3. The absolute value of this phase angle (35) can be calculated with great accuracy from the three scalar values representative of the magnitudes of the various alternating signals through simple laws of cosines as well-known to those skilled in the art. Importantly, great accuracy can be maintained even for relatively large variations in the magnitudes of the various vectors through the use of these scalar values rather than the techniques used by those skilled in the art at present, not particularly that of attempting to measure phase angle (35) directly.

As can be understood, since only scalar magnitudes are utilized, just two scalar magnitudes are not mathematically sufficient in order to know the magnitude of a third vector. The angle between the vectors must also be ascertained. As mentioned earlier, this requirement has lead those skilled in the art to attempt to measure this angle directly and has thus taught away from the direction taken by the present invention. Until the present invention, accurate phase measurement has been perceived to require heterodyning (mixing to a lower frequency) or an expensive, fast sensor in order to ascertain the phase difference. In these techniques, errors in mixing (though not usually significant), the significantly decreased bandwidth of the response, and the fact that small errors in the phase detection of large phase angles between current and voltage can lead to significant inaccuracies in the reported power and impedance. This makes a direct angle measurement undesirable. In addition, for processing plasma applications as the frequency of the applied power is increased, the inherent inaccuracies only increase. The present invention sharply departs from these techniques by utilizing only scalars representative of the magnitude of alternating signals from which to characterize processing plasma (2). In so doing, as those skilled in the art can immediately appreciate, it avoids perhaps the principal limitation on the accuracy of ascertaining delivered power and plasma impedance, experienced by those skilled is the art.

As mentioned earlier, probe (5) may or may not include some means for limiting the content of either the alternating signals or the scalar values to that of only a specific frequency. In the schematic representation shown in FIG. 1, this means for limiting is shown as means for limiting (18). It may also be separate means, one for each alternately signal or scalar value. As shown, the means for limiting (18) act upon the alternating signals. Since, as a nonlinear load, processing plasma (2) may inherently create effects upon the power transmission line which might be characterized as harmonic frequency content, the means for limiting is very important. In some instances where limiting was not employed, this harmonic content has resulted in inaccuracies in determining power utilized by and impedance of processing plasma (2). Since the processing plasma is nonlinear, harmonics of the fundamental frequency will be induced, even if the load appears to be matched at its fundamental frequency. As a result, the delivered power coupled into processing plasma (2) is the sum of the power levels of the fundamental as well as harmonic frequencies.

This would not be measured properly by prior art measurement techniques. It may be of value to measure the complex impedance at each significant harmonic frequency (typically the second through the fifth). The complex impedance at some of these frequencies could also result in the magnitude of the reflection coefficient being greater than one. Prior art designs do not allow for this type of complex impedance measurement, or any measurement at frequencies other than the fundamental. As the present invention discloses, each harmonic's respective power level and impedance may be monitored by the same measurement probe. This may provide further information as to the characteristics of processing plasma (2). It is also possible that the power level and impedance for some harmonic frequency might be more sensitive to changes than the power and impedance of the fundamental frequency. This would naturally be a key parameter for determining the end point for a given process. It could also be confirmed through using other indicators or techniques (such as optical sensors) for increased accuracy. By limiting the content of either the alternating signals or the scalar values to that of only a specific frequency, more accurate determinations can be made. Through the use of the broad concept of limiting content, a great variety of techniques are thereby encompassed ranging from simple filtering, to using coherent or non-coherent oscillators, to synchronize detection, to digital processing of sensed values. Each of these techniques could be readily applied to those skilled in the art. Through these techniques, the present invention expands the understanding of those working with processing plasmas to realize another component of their uniqueness in an electrical sense. As a nonlinear load, harmonic content cannot be ignored if accurate understandings of the character of processing plasma (2) are to be made. The wide-band approaches used in other arts teach away from this technique and can even be considered inaccurate for many applications.

As mentioned earlier, the signals originally sensed, the manner in which alternating signals are derived from them, and the nature of the scalar values representative of magnitude can be varied to a large degree and still fall within this patent. For instance, the signals chosen might be representative of forward power or voltage, reflected power or voltage, some multiple of the current through processing plasma (2), or the voltage across processing plasma (2). While some signals offer advantages in the applications currently envisioned, any two of these (and possibly other) variables could be chosen. Since a variety of mathematical models are available, all that is important is that the signals or values chosen be manipulatable so as to achieve a desired characterization of processing plasma (2). In the model preferred, signals representative of the sum of a voltage across processing plasma (2) and some multiple times the current through processing plasma (2), and the difference between the voltage across processing plasma (2) and some multiple times the current through processing plasma (2), and a combination of these two are chosen so as to easily achieve characterization of processing plasma (2).

Figure 4:
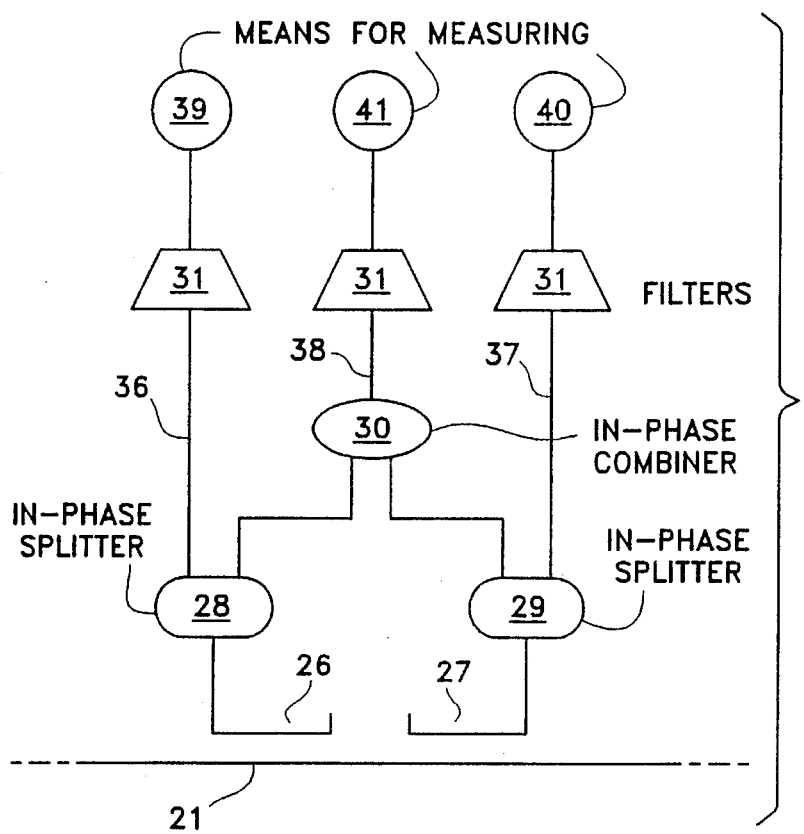
FIG. 4 shows a schematic diagram of a specific embodiment of the present invention utilizing directional couplers, signal splitters, and combiners.

In order to simplify both the means for sensing first and second signals (8 & 9) and the amount of manipulation necessary in order to achieve a characterization of processing plasma (2), first and second signals may be sensed by directional couplers. In another preferred embodiment a single bidirectional coupler may be used. Referring to FIG. 4, it can be seen that a first and second directional coupler (26 and 27) may be placed adjacent to power transmission line (21) within probe (5). In addition, utilizing microstrip designs (which are known to those skilled in the art), in conjunction with selecting the signals to be sensed properly, may yield an efficient, compact, cost-effective design.

Through the use of a directional coupler, the signal actually sensed from power transmission line (21) may be that representative of a sum of the voltage across processing plasma (2) and some multiple of the current passing through processing plasma (2). Likewise, second means for sensing (9) may also sense a signal representative of the difference between the voltage across processing plasma (2) and the same multiple of current passing through processing plasma (2). In the embodiment, the multiple involved is representative of the characteristic impedance of probe (5). Naturally, any mathematical variation including sums, squares, differences, halves, and the like can be utilized and still fall within the scope of this patent.

Although somewhat in less use at lower frequencies (less than 50 MHz), the use of a directional coupler to sense signals for the determination of impedance is known to those skilled in the art. Through this invention, a forward and reflected power (or voltage) sample, combined with knowledge of the phase angle between them, can determine delivered power and the complex impedance of processing plasma (2). In selecting directional coupler or other devices which are appropriate to this specific field, the large dynamic ranges involved dictate certain criteria. In this field, to minimize calculations, it may be advantageous for the directional coupler to have a flat (constant) coupling coefficient that is independent of power or impedance and to have exceptional directivity.

In addition, a microstrip directional coupler can offer advantages as a sensor in this application. A principal advantage of such a sensor is that it can be reproduced photo-lithographically, and thus precisely and inexpensively. Another advantage is that it can be designed to contain no magnetic material, such as ferrites or powdered irons, which add cost, nonlinearities, and greatly increase sensitivity to temperature and manufacturing process details. Directional couplers of the type outlined above were first constructed and used as power measurement components in a 50 ohm environment, without the impedance detection circuitry. The coupler design can be made simply, with a main strip from input to output and two coupled strips parallel to the main strip providing the signals.

As mentioned earlier, by using signals which are merely representative of the values stated, any mathematical variation such as halving, squaring and the like is encompassed by this patent. The significant element is that through the utilization of these signals, further mathematical analysis can be effected from which a characterization of processing plasma (2) might be reached.

In most applications, the present invention also departs from the prior art in that it avoids any need to sense current. Although a voltage sample is relatively easy to obtain, a current sample is somewhat more difficult, typically requiring ferromagnetic material to capture the current fields in the primary conductor. Such current sensors are not only difficult to calibrate at high frequencies, but are subject to changes with temperature and field strength in the magnetic material. The present invention avoids these limitations as well by disclosing a technique which accommodates signals which do not rely upon current sensing devices.

Referring to FIG. 4, additional embodiments of the present invention might be understood. As shown in FIG. 4, transmission line (21) acts upon first and second directional couplers (26 and 27) to create two sensed signals. These signals are then utilized to derive three alternating signals (36, 37 & 38). As can be seen, first and second alternating signals (36 and 37) are derived from first and second directional couplers (26 and 27) through the use of in-phase splitters (28 and 29). In-phase splitters (28 and 29) act to take the first and second sensed signals and split them so that they might also be fed into in-phase combiner (30). In-phase combiner (30) acts to combine first and second alternating signals to create third alternating signal (38).Together these serve as a means for deriving alternating signals.

In specifying the step of "combining" or some means for "combining," it is generally meant that the originally sensed signals or signals derived from them are utilized or added (with or without a delay) together to create an alternating waveform. It may be limited to utilizing only passive elements and may be limited to resulting in an alternating signal which has the same frequency as those supplied. Naturally, none of these techniques encompass the heterodyning technique as it utilizes a separately supplied signal.

Each of first alternating signal (36), second alternating signal (37) and third alternating signal (38) can then be fed through filters (31) or some other means for limiting the alternating signals to that of a specific chosen frequency. The magnitudes of the alternating signals can then be sensed by first, second, and third means for measuring (39, 40 & 41). Through this design it can be understood that components can be minimized to enhance both compactness and the cost effectiveness of the present invention. For example, for certain operating conditions and frequencies in-phase splitters (28 and 29) can even simply be nodes or electrical connections as could be well understood by those skilled in the art. In a preferred embodiment, the two in-phase power splitters are eliminated and are functionally replaced by a node since signal isolation is not a concern. For some applications where high impedance filtering is practical, the in-phase combiner could be replaced by two high impedance, substantially equal value resistors. This may allow one element (the in-phase combiner), to be replaced by the resistors. This approach greatly simplifies the design and facilitates placing it in the smallest possible package.

Figure 5:
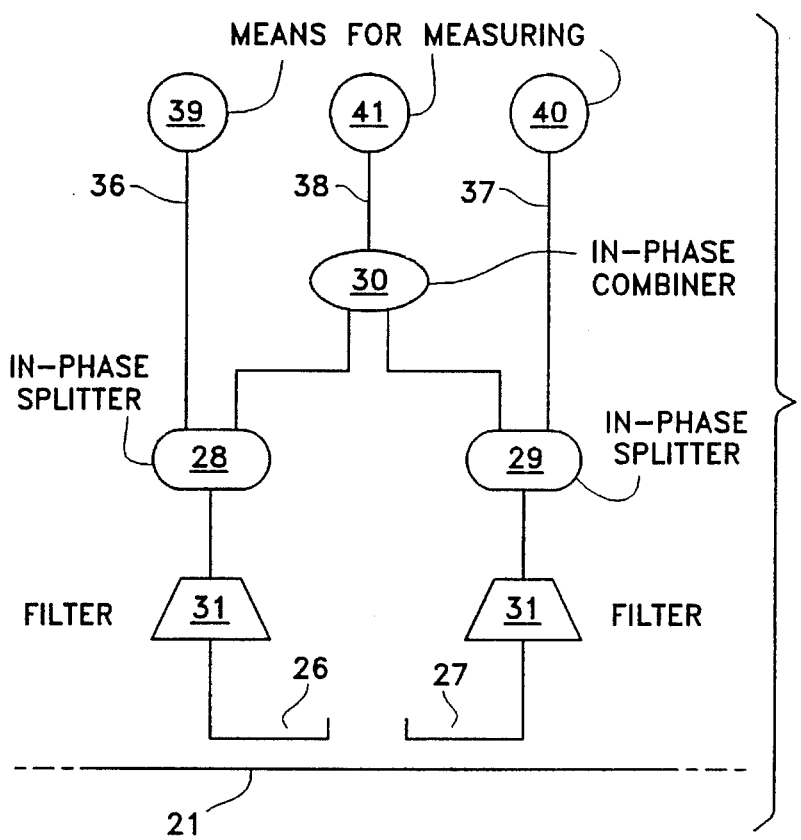
FIG. 5 shows an alternative embodiment of that shown in FIG. 4 illustrating another way to combine signals.

Referring to FIG. 5, it can be seen that the design may also be geometrically altered such that the means for limiting (18) is placed prior to in-phase splitters (28 and 29) and in-phase combiner (30). In this fashion, efficiencies are also gained such that the content of third alternating signal (38) is already limited to that of only the chosen specific frequency. This may afford further efficiencies in eliminating a potentially additional means for limiting the content of third alternating signal (38). Thus combining may occur before or after limiting the content of the signals.

As can be readily understood by those skilled in the art, and from a thorough understanding of the diagram shown in FIGS. 2 and 3, the relatively simple designs shown in FIGS. 4 and 5, yield a significant amount of information, but do not conclusively determine the full character of processing plasma (2) in that the sign of phase angle (35) or some other parameter may not be determinable from these simple inputs. Three different techniques for determining this sign are possible: assumption of the sign due to knowledge with respect to the character of typical processing plasmas, utilization of a sign bit detector, or addition of another sensed signal. The latter of these, addition of a third sensed signal, would probably be that most typically considered by those skilled in the art. Through this technique, a third (or fourth) sensed signal mathematically chosen to remove any ambiguity in the sign of this particular parameter would be utilized to derive a third (or fourth) alternating signal from which a fourth scalar could be derived representative of the magnitude of this alternating signal or otherwise. This scalar value could then be utilized in means for manipulating (17) to completely characterize processing plasma (2).

Alternatively, knowledge of the typical characteristics of processing plasmas could be utilized. When the load is solely capacitive, (such as a typical plasma load) or solely inductive, this information is sufficient to determine the unique impedance of the load. As envisioned, the knowledge that most processing plasmas are capacitive, and therefore have a negative phase angle, can be utilized by internally providing a preset input to means for manipulating (17). In this technique, while the three scalar values determined from the embodiments shown might yield the absolute value of phase angle (35), such preset input could be utilized to always set this absolute value as a negative value in characterizing processing plasma (2).

Figure 6:
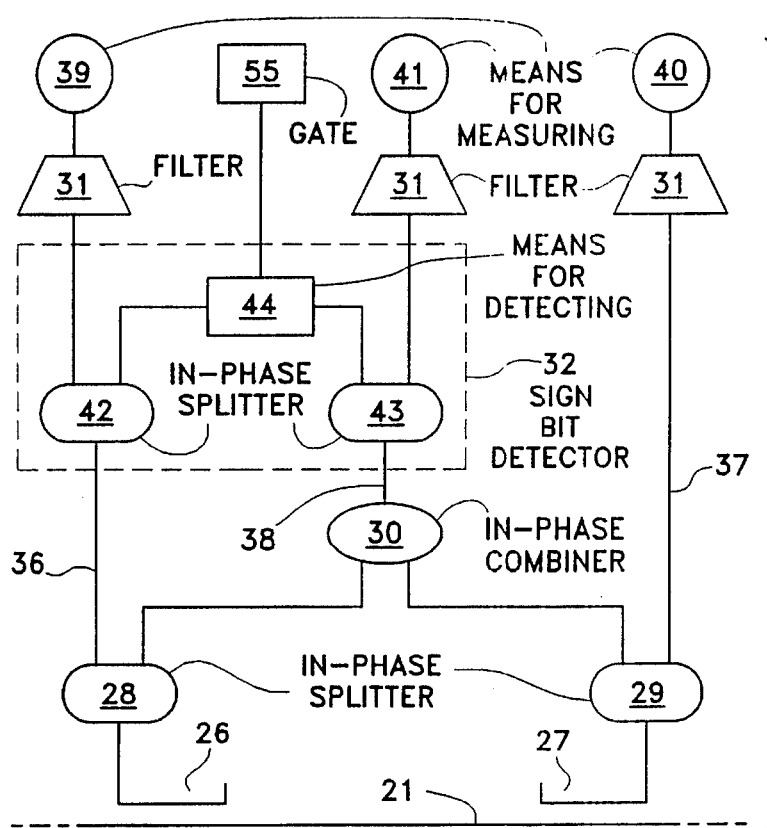
FIG. 6 shows another embodiment utilizing a sign bit detector to determine the plasma character.
Figure 7:
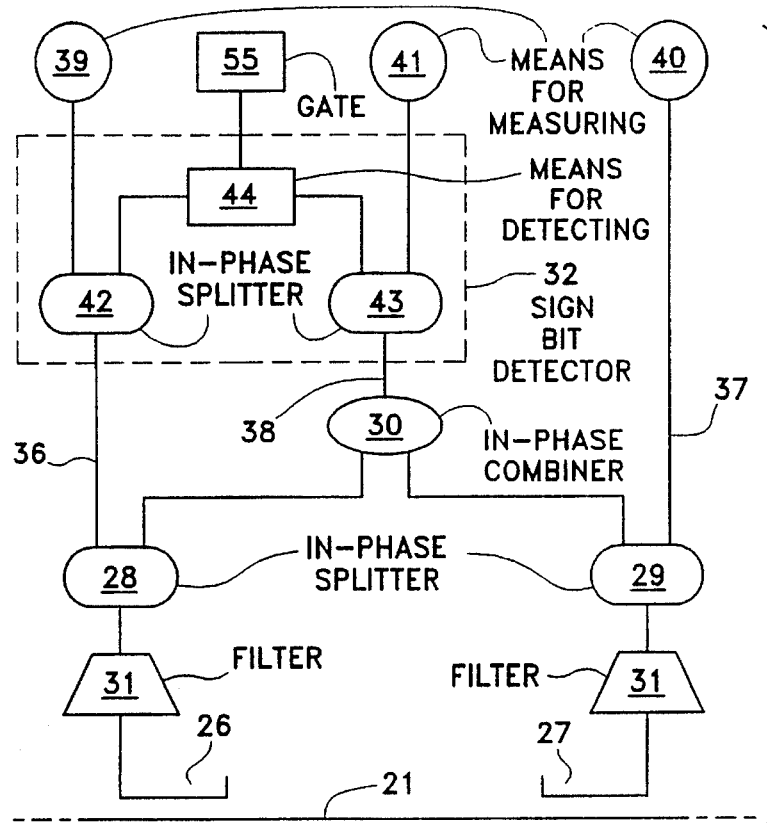
FIG. 7 shows an alternative embodiment of that shown in FIG. 6 with yet another way to combine signals.

In instances where the sign of phase angle (35) might vary from positive to negative, a sign bit technique might be utilized without any need to sense an additional signal. This can easily be accomplished with a simple sign bit detector circuit which compares the phase between the voltages. From this remaining information, the unique impedance of the load can be determined. Note that the accuracy of impedance measurement is only dependent upon the three voltage magnitudes and that the sign bit only indicates that the load is capacitive or inductive. As shown in FIG. 6, the design might utilize sign bit detector (32). As can be seen sign bit detector (32) has as inputs, both first alternating signal (36) and third alternating signal (38). In order to achieve this type of input, two additional in-phase splitters are used, namely, third in-phase splitter (42) and fourth in-phase splitter (43). Naturally, this design might also utilize second and third alternating signals or some different combination as can be readily understood. Alternative designs for the means for determining the angle (in particular its sign) are also possible including a zero crossing detector and a D flip-flop or a simple phase detector as would be well understood by those skilled in the art. Importantly, each of these techniques does not involve sensing an additional signal and thus minimizes space required by probe (5) next to power transmission line (21). As shown and discussed earlier, the phase properties of the signals are compared through use of a means for detecting the sign of the angle (44) this may then be analyzed by gate (55) to result in a discrete output (i.e. 0 or 1) based upon whether the sign of the angle is positive or negative. As can be seen in FIG. 7, sign bit detector (32) can also be configured to connect after filters (31).

One of the techniques utilized in prior art devices which attempt to ascertain the power delivered to processing plasma (2) is that of measuring power on transmission line (21) prior to matching network (4). In this fashion power output by alternating power source (1) may also be utilized. While this technique may have worked well in other fields, in the plasma processing field, the large variation in the plasma character makes this less appropriate. In order to overcome this limitation, the present invention is designed to achieve characterization of processing plasma (2) not only without measuring so distant (electrically speaking) from processing plasma (2), but also without requiring knowledge of the power output by alternating power source (1). The level of power output by alternating power source (1) is unknown to probe (5). This aspect is important as the large impedance and power ranges involved make any determination of power at other than a 50 ohm load potentially inaccurate. Through the selections detailed above, it can be seen that the present invention avoids any need for knowledge by probe (5) (as conceptually defined) of the power output by power source (1). This sharply departs from teachings where designs for impedance measurement may utilize a constant sinusoidal signal source. In these the signal is coupled through the measurement instrument to measure a device under test by coupling a portion of its power through couplers which measure the signal involved. In these fields the device under test is typically passive and linear so it can be assumed that the delivered power measured, and the calculated impedance of the load, is purely that of the fundamental frequency. This is often not the case in the plasma processing field.

Figure 8:
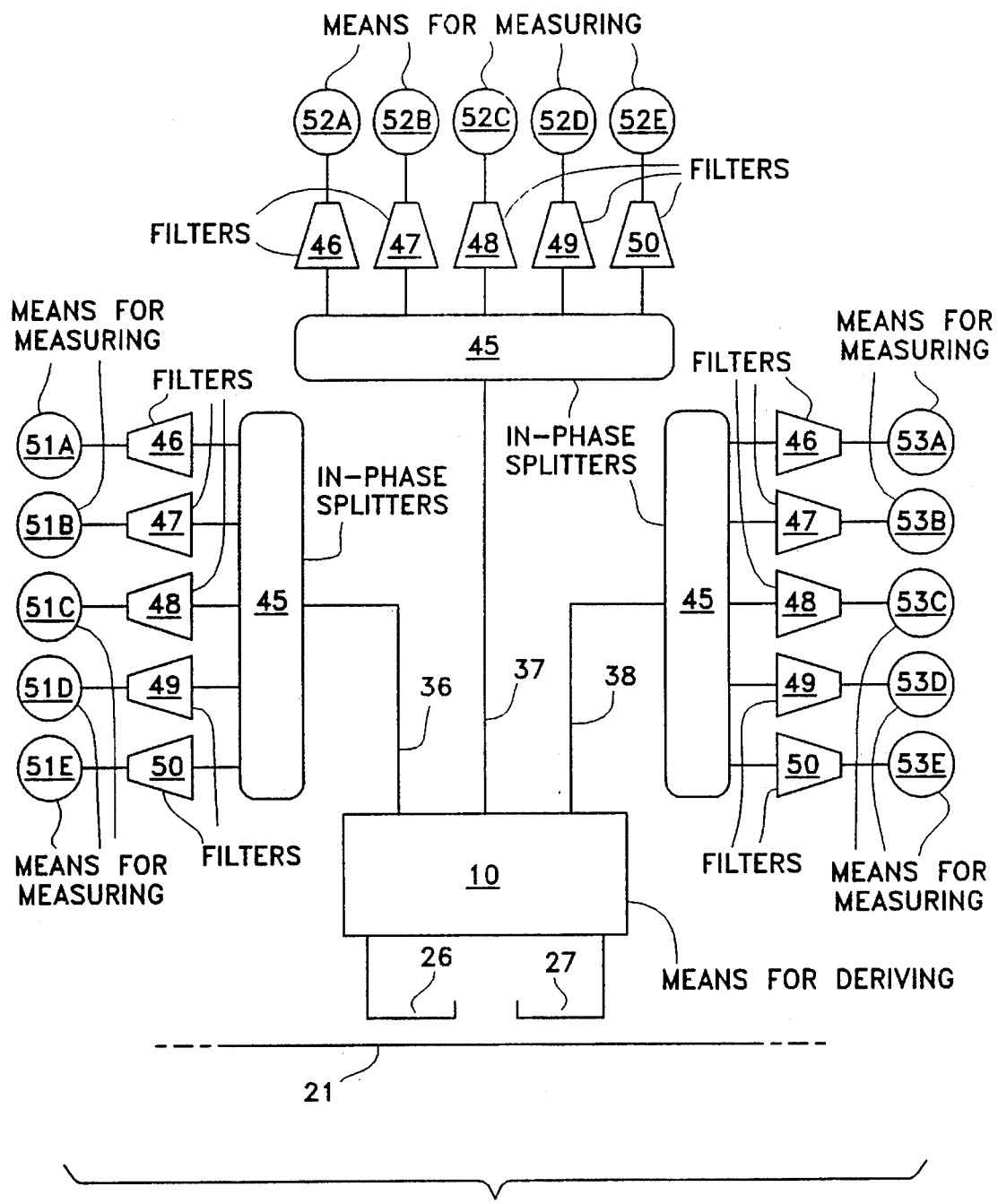
FIG. 8 is a schematic diagram similar to that shown in FIG. 3 schematically showing the capability to characterize the plasma simultaneously over a variety of frequencies with only a single frequency power source.

Referring to FIG. 8, yet another embodiment may be understood which can simultaneously ascertain the content and characteristics of processing plasma (2) at a variety of frequencies. As schematically shown, the embodiment involves sensing at least two signals through directional couplers (26 & 27) or some other means as discussed earlier. These signals are then utilized as discussed to generate three alternating signals (Shown generally at FIG. 4 as items 36, 37 and 38). These signals are then divided through the use of multiple port in-phase splitters (45). Each output of multiple port in-phase splitters (45) is then fed into some filter (46–50) which is coordinated with like filter elements from the other multiple port in-phase splitters (45). As can be easily understood, the coordinated filters (46–50) act to provide a specific alternating signal for each frequency. The magnitude of each of these limited signals is then measured and the resultant scalar values are used to characterize processing plasma (2) at the selected frequencies. For example, the scalar values measured by means for measuring (51A, 52A, and 53A) might together be manipulated to characterize processing plasma (2) at the fundamental frequency; the scalar values measured by means for measuring (51B, 52B, and 53B) might together be manipulated to characterize processing plasma (2) at the second harmonic. Naturally any number of filter elements can be selected as appropriate to the processing involved. Additionally, for applications where it is also advantageous to know the power levels and impedances of the significant harmonic frequencies where these frequencies are too high to be accurately converted digitally, multiple reference frequencies could be used in the mixing of the signals to obtain the adequate number of lower frequency signals. Generally it should be understood that the three measurement signals can be split into as many signals as is practical to derive the information from as many harmonics as is needed. These do not necessarily have to be those of consecutive harmonics. Numerous sign bit detectors can be used as well.

The foregoing discussion and the claims which follow describe the preferred embodiments of the present invention. Particularly with respect to the claims, it should be understood that changes may be made, combinations created, and elements varied without departing from the essence of the invention. In this regard, it is intended that such changes would still fall within the scope of the present invention. It simply is not practical to describe and claim all possible revisions to the present invention which may be accomplished. To the extent such revisions utilize the essence of the present invention, each would naturally fall within the breadth of protection encompassed by this patent. This is particularly true for the present invention since its basic concepts and understandings are fundamental in nature and can be broadly applied.

I claim:

1. A method of characterizing a plasma being subjected to an alternating power transmission comprising the steps of:
   a. accepting said alternating power transmission as an input;
   b. sensing at least two signals from said alternating power transmission;
   c. deriving at least three alternating signals from said sensed signals;
   d. measuring at least three scalar values from said alternating signals wherein each of said scalar values are representative of the magnitude of the alternating signals;
   e. manipulating said measured scalar values as variable inputs to characterize the plasma; and
   f. passing a substantial portion of said alternating power transmission through to said plasma.

2. A method of characterizing a plasma being subjected to an alternating power transmission as described in claim 1 and further comprising the step of limiting the content of said scalar values to that of only a specific frequency.

3. A method of characterizing a plasma being subjected to an alternating power transmission as described in claim 2 wherein said step of limiting the content of said scalar values to that of only a specific frequency is accomplished prior to measuring said scalar values.

4. A method of characterizing a plasma being subjected to an alternating power transmission as described in claim 1 or 3 wherein said step of manipulating said measured scalar values as variable inputs to characterize the plasma comprises the step of ascertaining the power delivered to said plasma.

5. A method of characterizing a plasma being subjected to an alternating power transmission as described in claim 1 or 3 wherein said alternating power transmission created by a power source having an output level, wherein said power transmission is both accepted and passed through by a probe which also accomplishes the step of manipulating said measured scalar values as variable inputs to characterize the plasma and wherein the level of said output level is unknown to said probe.

6. A method of characterizing a plasma being subjected to an alternating power transmission as described in claim 1 or 3 wherein said plasma is characterized by a parameter having a positive or negative sign and wherein said step of manipulating said scalar signals to characterize said plasma comprises the steps of:
   a. calculating the absolute value of said parameter of the plasma through utilization of said scalar values; and
   b. determining the sign of said parameter of said plasma through assuming the sign of said parameter of the plasma.

7. A method of characterizing a plasma being subjected to an alternating power transmission comprising the steps of:
   a. accepting said alternating power transmission;
   b. sensing a first signal from said alternating power transmission;
   c. deriving a first alternating signal from said first signal;
   d. measuring a first scalar value from said first alternating signal wherein said first scalar value is representative of the magnitude of said first alternating signal;
   e. sensing a second signal from said alternating power transmission;
   f. deriving a second alternating signal from said second signal;
   g. measuring a second scalar value from said second alternating signal wherein said second scalar value is representative of the magnitude of said second alternating signal;
   h. combining said first and said second alternating signals to create a third alternating signal;
   i. measuring a third scalar value representative of the magnitude of said third alternating signal;
   j. manipulating said first, second, and third scalar values to characterize said plasma; and
   k. passing a substantial portion of said alternating power transmission through to said plasma.

8. A method of characterizing a plasma being subjected to an alternating power transmission as described in claim 7 and further comprising the step of limiting the content of said scalar values to that of only a specific frequency.

9. A method of characterizing a plasma being subjected to an alternating power transmission as described in claim 7 wherein said first signal is representative of the sum of a voltage across said plasma and a multiple of the current passing through to said plasma, and wherein said second alternating signal is representative of the difference between said voltage across said plasma and said multiple of the current passing through to said plasma.

10. A method of characterizing a plasma being subjected to an alternating power transmission as described in claim 1 wherein said step of sensing at least two signals from said alternating power transmission comprises the step of sensing three signals.

11. A method of characterizing a plasma being subjected to an alternating power transmission comprising the steps of:
   a. accepting said alternating power transmission;
   b. sensing a first signal from said alternating power transmission wherein said first signal is representative of the sum of a voltage across said plasma and a multiple of the current passing through to said plasma;
   c. deriving a first alternating signal from said first signal;
   d. limiting the content of said first alternating signal to that of only a specific frequency;
   e. measuring a first scalar value from said first alternating signal wherein said first scalar value is representative of the magnitude of said first alternating signal;

f. sensing a second signal from said alternating power transmission wherein said second alternating signal is representative of the difference between said voltage across said plasma and said multiple of the current passing through to said plasma;

g. deriving a second alternating signal from said second signal;

h. limiting the content of said second alternating signal to that of only said specific frequency;

i. measuring a second scalar value from said second alternating signal wherein said second scalar value is representative of the magnitude of said second alternating signal;

j. ascertaining a third alternating signal;

k. measuring a third scalar value from said third alternating signal wherein said third scalar value is representative of the magnitude of said third alternating signal;

l. manipulating said first, second, and third scalar values to characterize said plasma; and m. passing a substantial portion of said alternating power transmission through to said plasma.

12. A method of characterizing a plasma being subjected to an alternating power transmission as described in claim 11 wherein said step of ascertaining said third alternating signal comprises the step of combining said first and said second alternating signals to create a third alternating signal.

13. A method of characterizing a plasma being subjected to an alternating power transmission as described in claim 12 and further comprising the step of limiting the content of said third alternating signal to that of only said specific frequency.

14. A method of characterizing a plasma being subjected to an alternating power transmission as described in claim 13 wherein said step of limiting the content of said third alternating signal comprises the step of combining said first and second alternating signals after accomplishing said step of limiting the content of said first and second alternating signals.

15. A method of characterizing a plasma being subjected to an alternating power transmission as described in claim 13 wherein said step of combining said first and second alternating signals is accomplished before accomplishing said step of limiting the content of said first and second alternating signals.

16. A method of characterizing a plasma being subjected to an alternating power transmission as described in claim 11 wherein said step of ascertaining said third alternating signal comprises the steps of:

a. sensing a third signal from said alternating power transmission; and b. deriving a third alternating signal from said third signal.

17. A method of characterizing a plasma being subjected to an alternating power transmission as described in claim 16 and further comprising the step of limiting the content of said third signal to that of only said specific frequency.

18. A method of characterizing a plasma being subjected to an alternating power transmission as described in claim 9 or 11 wherein said alternating power transmission has a voltage and wherein each of said first and second scalar values are proportional to said voltage.

19. A method of characterizing a plasma being subjected to an alternating power transmission as described in claim 9 or 11 wherein said first and second signals have an angle between them and wherein said step of manipulating said first, second, and third scalar values to characterize said plasma comprises the step of ascertaining the angle between said first and second signals.

20. A method of characterizing a plasma being subjected to an alternating power transmission as described in claim 9 or 11 wherein said plasma has a complex impedance and wherein said step of manipulating said first, second, and third scalar values to characterize said plasma comprises the step of ascertaining the complex impedance of said plasma.

21. A method of characterizing a plasma being subjected to an alternating power transmission as described in claim 9 or 11 wherein said plasma has a reflection coefficient and wherein said step of manipulating said first, second, and third scalar values to characterize said plasma comprises the step of ascertaining the reflection coefficient of said plasma.

22. A method of characterizing a plasma being subjected to an alternating power transmission as described in claim 21 and further comprising the step of manipulating said first and second scalar values to ascertain the power delivered to said plasma.

23. A method of characterizing a plasma being subjected to an alternating power transmission as described in claim 9 or 11 wherein said power transmission is created by a power source having an output level, wherein said manipulation is accomplished by a probe and wherein said output level by the power source is unknown to said probe.

24. A method of characterizing a plasma being subjected to an alternating power transmission as described in claim 11 wherein said step of limiting the content of said first signal to that of only a specific frequency comprises the step of filtering said first signal prior to measuring said first scalar value and wherein said step of limiting the content of said second signal to that of only a specific frequency comprises the step of filtering said second signal prior to measuring said second scalar value.

25. A method of characterizing a plasma being subjected to an alternating power transmission as described in claim 9 or 11 wherein said plasma has a variable parameter having a positive or negative sign and wherein said step of manipulating said first, second, and third scalar values to characterize said plasma comprises the step of:

a. calculating the absolute value of said parameter of the plasma; and b. be determining the sign of said parameter of said plasma through assuming the sign of said parameter of the plasma.

26. A method of characterizing a plasma being subjected to an alternating power transmission as described in claim 3 or 11 wherein said step of limiting the content comprises the step of filtering, converting to a different signal through utilization of a coherent oscillator, converting to a different signal through utilization of a non-coherent oscillator and then filtering, or synchronously detecting values.

27. A circuit to characterize a plasma being subjected to an alternating power transmission comprising:

a. a means for accepting a power transmission;

b. a means for sensing at least two signals from said power transmission provided by said means for accepting;

c. a means for deriving at least three alternating signals from said signals provided by said means for sensing;

d. a means for measuring at least three scalar values from said alternating signals wherein said scalar values are representative of the magnitude of the alternating signals;

e. a means for manipulating said measured scalar values as variable inputs to characterize the plasma; and f. a means for passing a substantial portion of said power transmission from said means for accepting to said plasma.

28. A circuit to characterize a plasma being subjected to an alternating power transmission as described in claim 27 and further comprising a means for limiting the content of said sensed scalar values to that of only a specific frequency.

29. A circuit to characterize a plasma being subjected to an alternating power transmission as described in claim 28 wherein said means for sensing comprises:
 a. a means for sensing a first signal; and
 b. a means for sensing a second signal;
and wherein said means for deriving alternating signals comprises:
 a. a means for deriving a first alternating signal from said first signal provided by said means for sensing said first signal;
 b. a means for deriving a second alternating signal from said second signal provided by said means for sensing said second signal; and
 c. a means for deriving a third alternating signal;
and wherein said means for measuring scalar values representative of the magnitude of the sensed signals comprises:
 a. a means for measuring a first scalar value representative of the magnitude of the first alternating signal;
 b. a means for measuring a second scalar value representative of the magnitude of the second alternating signal; and
 c. a means for measuring a third scalar value representative of the magnitude of the third alternating signal.

30. A circuit to characterize a plasma being subjected to an alternating power transmission as described in claim 29 wherein said means for deriving the third alternating signal comprises a means for combining said first and second alternating signals.

31. A circuit to characterize a plasma being subjected to an alternating power transmission as described in claim 29 and further comprising a means for sensing a third signal.

32. A circuit to characterize a plasma being subjected to an alternating power transmission as described in claim 29 wherein the first alternating signal is representative of the sum of a voltage across said plasma and a multiple of the current passing through to said plasma, and wherein said second alternating signal is representative of the difference between said voltage across said plasma and said multiple of the current passing through to said plasma.

33. A circuit to characterize a plasma being subjected to an alternating power transmission comprising:
 a. a means for accepting a power transmission;
 b. a means for sensing a first signal from said power transmission provided by said means for accepting;
 c. a means for deriving a first alternating signal from said first signal provided by said means for sensing said first signal;
 d. a means for measuring a first scalar value representative of the magnitude of said first alternating signal;
 e. a means for sensing a second signal from said power transmission provided by said means for accepting;
 f. a means for deriving a second alternating signal from said second signal provided by said means for sensing said second signal;
 g. a means for measuring a second scalar value representative of the magnitude of said second alternating signal;
 h. a means for combining said first and said second alternating signals to create a third alternating signal;
 i. a means for measuring a third scalar value representative of the magnitude of said third alternating signal;
 j. a means for manipulating said measured scalar values as variable inputs to characterize the plasma; and
 k. a means for passing a substantial portion of said power transmission from said means for accepting to said plasma.

34. A circuit to characterize a plasma being subjected to an alternating power transmission as described in claim 27 wherein said means for sensing comprises:
 a. a means for sensing a first signal;
 b. a means for sensing a second signal; and
 c. a means for sensing a third signal;
and wherein said means for deriving alternating signals comprises:
 a. a means for deriving a first alternating signal from said first signal provided by said means for sensing said first signal;
 b. a means for deriving a second alternating signal from said second signal provided by said means for sensing said second signal; and
 c. a means for deriving a third alternating signal from said third signal provided by said means for sensing said third signal;
and wherein said means for measuring scalar values representative of the magnitude of the sensed signals comprises:
 a. a means for measuring a first scalar value representative of the magnitude of the first alternating signal;
 b. a means for measuring a second scalar value representative of the magnitude of the second alternating signal; and
 c. a means for measuring a third scalar value representative of the magnitude of the third alternating signal.

35. A circuit to characterize a plasma being subjected to an alternating power transmission as described in claim 33 or 34 wherein the first alternating signal is representative of the sum of a voltage across said plasma and a multiple of the current passing through to said plasma, and wherein said second alternating signal is representative of the difference between said voltage across said plasma and said multiple of the current passing through to said plasma.

36. A circuit to characterize a plasma being subjected to an alternating power transmission as described in claim 35 wherein said means for limiting the content comprises:
 a. a means for limiting the content of said first scalar value to that of only a specific frequency; and
 b. a means for limiting the content of said second scalar value to that of only a specific frequency.

37. A circuit to characterize a plasma being subjected to an alternating power transmission as described in claim 28 wherein said means for limiting the content of said scalar signals to that of only a specific frequency comprises a filter, a coherent oscillator, a non-coherent oscillator and a filter, or a synchronous detector.

38. A circuit to characterize a plasma being subjected to an alternating power transmission as described in claim 36 wherein said means for limiting the content of said scalar signals to that of only a specific frequency comprises a filter, a coherent oscillator, a non-coherent oscillator and a filter, or a synchronous detector.

39. A circuit to characterize a plasma being subjected to an alternating power transmission as described in claim 27, 28, or 33 wherein said means for manipulating is contained within a probe, and wherein said power transmission has an output level and wherein said output level is unknown to said probe.

40. A circuit to characterize a plasma being subjected to an alternating power transmission as described in claim 29, 31, or 33 and further comprising:

a. a means for sensing a fourth signal from said power transmission;

b. a means for deriving a fourth alternating signal from said fourth signal; and c. a means for measuring a fourth scalar value representative of the magnitude of said fourth alternating signal.

41. A circuit to characterize a plasma being subjected to an alternating power transmission as described in claim 40 wherein the aspect which said fourth scalar value represents is selected to overcome any ambiguity in characterizing said plasma.

42. A circuit to characterize a plasma being subjected to an alternating power transmission as described in claim 34 and further comprising:

a. a means for limiting the content of said first signal to a specific frequency wherein said means for limiting said first signal is connected between said means for sensing said first signal and said means for measuring said first scalar value;

b. a means for limiting the content of said second signal to said specific frequency wherein said means for limiting said second signal is connected between said means for sensing said second signal and said means for measuring said second scalar value;

c. a means for limiting the content of said third signal to said specific frequency wherein said means for limiting said third signal is connected between said means for sensing said third signal and said means for measuring said third scalar value;

d. a means for sensing a fourth signal from said power transmission;

e. a means for deriving a fourth alternating signal from said fourth signal;

f. a means for limiting the content of said fourth signal to said specific frequency wherein said means for limiting said fourth signal is connected between said means for sensing said fourth signal and said means for measuring said fourth scalar value;

g. a means for measuring a fourth scalar value representative of the magnitude of said fourth alternating signal.

43. A circuit to characterize a plasma being subjected to an alternating power transmission as described in claim 33 wherein said means for sensing a first signal and said means for sensing a second signal each comprise a directional coupler.

44. A circuit to characterize a plasma being subjected to an alternating power transmission as described in claim 43 wherein said means for combining comprises an in-phase combiner connected to said first and said second alternating signals.

45. A circuit to characterize a plasma being subjected to an alternating power transmission as described in claim 29, 33 or 43 wherein said plasma is contained within a processing chamber having an input, wherein said means for sensing a first signal is responsive to said input, and wherein said means for sensing a second signal is responsive to said input.

46. A circuit to characterize a plasma being subjected to an alternating power transmission as described in claim 43 wherein said third scalar value is representative of a plasma voltage and wherein said means for combining comprises two substantially equal high impedance resistors connected after said means for sensing said first and said second signals.

47. A circuit to characterize a plasma being subjected to an alternating power transmission as described in claim 27 wherein at least two of said sensed signals have an angle between them, and wherein said means for manipulating said measured scalar values as variable inputs to characterize the plasma comprises a means for determining the angle between said two sensed signals.

48. A circuit to characterize a plasma being subjected to an alternating power transmission as described in claim 47 wherein said means for determining the angle between said two signals comprises a sign detector.

49. A circuit to characterize a plasma being subjected to an alternating power transmission as described in claim 48 wherein said sign detector comprises a preset input.

50. A circuit to characterize a plasma being subjected to an alternating power transmission as described in claim 47 wherein said means for determining said angle comprises two in-phase splitters, a zero crossing detector and a D flip-flop, or a phase detector.

51. A circuit to characterize a plasma being subjected to an alternating power transmission as described in claim 33 or 43 wherein at least two of said sensed signals have an angle between them, and wherein said means for manipulating said measured scalar valued as variable inputs to characterize the plasma comprises a means for determining the angle between said two sensed signals.

52. A circuit to characterize a plasma being subjected to an alternating power transmission as described in claim 51 wherein said means for determining the angle between said two signals comprises a sign detector.

53. A circuit to characterize a plasma being subjected to an alternating power transmission as described in claim 52 wherein said sign detector comprises a preset input.

54. A circuit to characterize a plasma being subjected to an alternating power transmission as described in claim 51 wherein said means for determining said angle comprises two in-phase splitters, a zero crossing detector and a D flip-flop, or a phase detector.

55. A circuit to characterize a plasma being subjected to an alternating power transmission as described in claim 51 wherein said means for combining comprises a node connected to said first and second alternating signals.

56. A circuit to characterize a plasma being subjected to an alternating power transmission as described in claim 54 wherein said means for combining comprises a node connected to said first and second alternating signals.

\* \* \* \* \*